United States Patent [19]

Wieters

[11] Patent Number: 4,492,891

[45] Date of Patent: Jan. 8, 1985

[54] PIEZOELECTRIC ACTUATOR ARRANGEMENT WITH ADJUSTMENT FOR WEAR

[75] Inventor: Heinz Wieters, Hamburg, Fed. Rep. of Germany

[73] Assignee: U.S. Philips Corporation, New York, N.Y.

[21] Appl. No.: 477,031

[22] Filed: Mar. 21, 1983

[30] Foreign Application Priority Data

Apr. 1, 1982 [DE] Fed. Rep. of Germany ....... 3212062

[51] Int. Cl.[3] ........ H01L 41/08

[52] U.S. Cl. ........ 310/328

[58] Field of Search ........ 310/328, 330, 331; 400/124

[56] References Cited

U.S. PATENT DOCUMENTS

| | | | |
|---|---|---|---|
| 1,980,888 | 11/1934 | Thomas | 310/328 X |
| 3,292,019 | 12/1966 | Hsu et al. | 310/328 |
| 3,377,489 | 4/1968 | Brisbane | 310/328 X |
| 3,390,559 | 7/1968 | Steutzer | 310/328 X |
| 3,473,466 | 10/1969 | Thayer | 310/328 X |
| 3,808,488 | 4/1974 | Massa | 310/328 |
| 3,919,943 | 11/1975 | Beery | 310/328 X |
| 4,193,703 | 3/1980 | Sakmann | 310/328 X |
| 4,382,243 | 5/1983 | Babitzka | 310/328 X |

*Primary Examiner*—Mark O. Budd

*Attorney, Agent, or Firm*—David R. Treacy

[57] ABSTRACT

An actuator arrangement for urging a ram against a controlled device. An actuator such as a stack of piezoelectric disks is mounted and moves together with the ram along a line of movement. An end of the ram remote from the controlled device is engaged by readjusting elements which urge that end of the ram toward the controlled elements, and is also engaged by a releasable locking actuator which locks the ram end with respect to the controlled device. While the working actuator is energized, release and re-application of the locking actuator enables play in the actuator arrangement to be taken up.

6 Claims, 2 Drawing Figures

PIEZOELECTRIC ACTUATOR ARRANGEMENT WITH ADJUSTMENT FOR WEAR

BACKGROUND OF THE INVENTION

The invention relates to an actuator arrangement comorising an actuator which acts upon an adjusting member or controlled device by means of a ram.

Such actuator arrangements serve, for example, to operate electrical or mechanical valves. During the working process, the ram position once adjusted may change due to, for example, ageing of material. In order that the ram can fulfil its function accurately, it is necessary to correct or to readjust its position with respect to the adjusting member or controlled device in due course.

SUMMARY OF THE INVENTION

The invention has for its object to provide an actuator arrangement comprising a readjustable operating ram.

According to the invention, this object is achieved in that the actuator is arranged together with the ram so as to be displaceable along the line of movement of the ram, in that this ram co-operates with a readjusting abutment at the end of the ram remote from the controlled device or adjusting member and in that the ram, which, when acting upon the controlled device during the working process, is immovably fixed on the side of the ram remote from the controlled device by means of a locking actuator; and which is released during readjustment by the locking actuator for longitudinal displacement.

At given time intervals or during inoperative periods, the ram can then be readjusted in that, after the locking actuator has been released, it is fully moved towards the controlled device by means of the readjusting abutment. Subsequently, the locking actuator is made operative again and the ram is locked in the newly adjusted operating position.

According to an embodiment of the invention, the readjusting abutment consists of a thrust block with a compression spring arranged between the thrust block and the ram. The compression spring urges, when the locking actuator is released, the ram against the controlled device.

Another embodiment of the readjusting abutment is characterized in that the thrust block consists of a wedge which is displaced at right angles to the axis of the ram towards the ram end remote from the controlled device. When the locking actuator is released, the wedge can then be moved behind the ram and push it towards the controlled device. Subsequently, the locking actuator becomes operative again.

According to a further embodiment of the invention, the actuators consist of a stack of piezoelectric disks.

The invention will now be described more fully with reference to the embodiment shown in the drawing.

DESCRIPTION OF THE PREFERRED EMBODIMENTS

Figure 1:
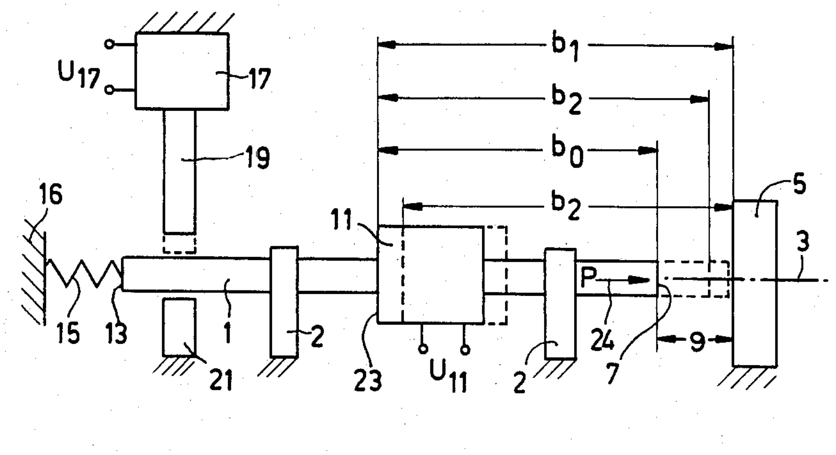
FIG. 1 is a diagrammatic representation of the construction of the actuator arrangement with means for readjusting the operating ram.

In the diagrammatic representation of FIG. 1, a ram 1 is guided or journalled in bearings 2 so as to be displaceable along a line of movement 3. This ram may be a valve ram or the like, which acts upon a controlled device 5 (shown diagrammatically), for example, a valve. In the rest position, an air gap 9 is present between the front edge 7 of the ram and the controlled device 5.

Between the bearings 2 is disposed an actuator 11, which consists, for example, of piezoelectric disks stacked in the direction of the line 3. The ram 1 is engaged at its end 13 remote from the adjusting member 5 by a compression spring 15 supported by a stationary thrust block 16. Further a locking actuator 17 acts upon the ram 1 between the actuator 11 and the ram end 13. For this purpose, the locking actuator is provided with a die 19, which can be placed on the ram 1 at right angles to the longitudinal direction of this ram and in this case urges the ram against a thrust bearing 21. Just like the working actuator 11, the locking actuator 17 may also be composed of piezoelectric disks. However, it is alternatively possible to construct it simply as an electromagnet.

The mechanical readjustment by means of the readjusting arrangement is effected as follows: in normal operation, in the rest position the front surface 7 of the ram 1 maintains the distance 9 from the controlled device 5. The distance between the end 23 of the working actuator 11 remote from the adjusting member 5 and the front surface 7 of the ram then has a value $b_0$. The voltage $U_{17}$ is applied to the locking actuator 17. As a result, the locking actuator 17 urges the die 19 against the ram 1 and fixes it immovably in its longitudinal direction. When now the voltage $U_{11}$ is applied to the working actuator 11, the working actuator 11 is adjusted to the desired position and the front surface 7 of the ram abuts against the controlled device 5. The distance between the end 23 of the working actuator 11 and the front surface 7 of the ram is then $b_1$. By alternately energizing and de-energizing the working actuator 11 the front surface 7 of the ram is therefore lifted from the controlled device 5 or is urged again with the force P in the direction of the arrow 24 against the controlled device 5 in the corresponding alternating cycle. It now appears that due to ageing the working actuator 11 shrinks in length in the direction of the ram from $b_1$ to $b_2$. In order to compensate for this shrinkage, the readjusting arrangement is made operative. First the voltage $U_{17}$ is removed from the locking actuator 17 so that the die 19 is detached from the ram 1. Thus, the ram 1 becomes displaceable in the direction of the line 3 and the compression spring 15 urges the ram against the controlled device 5 when the working actuator 11 is energized by the voltage $U_{11}$. When the front surface 7 of the ram has engaged the controlled device 5, the locking actuator is energized again and the die 19 again fixes the ram 1. The ram 1 now again acts upon the controlled device 5, as before the shrinkage.

Figure 2:
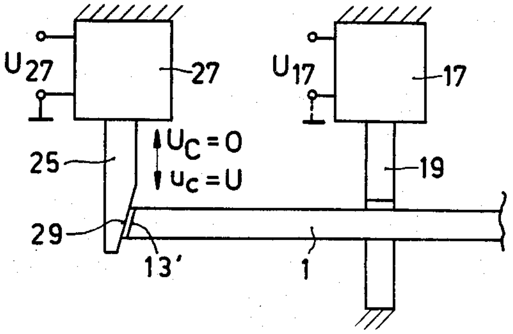
FIG. 2 shows a modified embodiment of a readjusting abutment.

FIG. 2 shows another embodiment of the lefthand part of the whole arrangement of FIG. 1. The compression spring 15 and the thrust block 16 of FIG. 1 are now replaced by a readjusting die 25 of an electrically operable readjusting actuator 27. When a readjustment is required, as soon as the locking actuator 17 detaches its die 19 from the ram 1 so that the latter becomes freely displaceable, the readjusting actuator 27 is connected to the voltage $U_{27}$ and the readjusting die 25 is displaced at right angles to the ram 1 with an oblique wedge surface 29 towards a corresponding readjusting surface 13' of the ram 1. When the readjustment has been accomplished, the locking actuator 17 is energized again and the die 19 fixes the ram 1, while the readjusting actuator 27 is de-energized. However, it may alternatively remain energized to maintain a thrust block.

In order to achieve a buffering, it is also possible to construct the ram 1 so as to be resiliently arranged between the die 19 and the readjusting die 25.

What is claimed is:

1. An actuator arrangement for a controlled device, comprising a ram having a front surface and an end remote from the front surface, means for guiding the ram for movement along a line of movement such that the front surface is movable toward and away from the controlled device, and an actuator for urging the front surface of the ram against the controlled device, characterized in that the actuator is arranged to be displaceable along the line of movement together with the ram, and the arrangement further comprises a re-adjusting abutment means for engaging said remote end of the ram and urging said remote end along said line of movement toward the controlled device, the re-adjusting abutment means consisting of a thrust block and a compression spring arranged between the thrust block and a compression spring arranged between the thrust block and the ram, and a releasable locking actuator for locking the position of said remote end with respect to said controlled device.

2. An arrangement as claimed in claim 1, characterized in that at least the actuator consists of a stack of piezoelectric disks.

3. An actuator arrangement for a controlled device, comprising a ram having a front surface and an end remote from the front surface, means for guiding the ram for movement along a line of movement such that the front surface is movable toward and away from the controlled device, and an actuator for urging the front surface of the ram against the controlled device, characterized in that the actuator is arranged to be displaceable along the line of movement together with the ram, and the arrangement further comprises a re-adjusting abutment means for engaging said remote end of the ram and urging said remote end along said line of movement toward the controlled device, the re-adjusting abutment means comprising a wedge engaging said remote end and arranged to be moveable transversely to said line of movement, and a releasable locking actuator for locking the position of said remote end with respect to said controlled device.

4. An arrangement as claimed in claim 3, characterized in that at least the actuator consists of a stack of piezoelectric disks.

5. An arrangement as claimed in claim 3, characterized in that the re-adjusting abutment means further comprises an electrically operable re-adjusting actuator for moving said wedge transversely to said line of movement.

6. An arrangement as claimed in claim 5, characterized in that the actuator and the releasable locking actuator each comprise a stack of piezoelectric disks.

* * * * *

UNITED STATES PATENT AND TRADEMARK OFFICE
CERTIFICATE OF CORRECTION

PATENT NO. : 4,492,891

DATED : January 8, 1985

INVENTOR(S) : HEINZ WIETERS

It is certified that error appears in the above—identified patent and that said Letters Patent is hereby corrected as shown below:

Claim 1, lines 18,19, Delete "the thrust block and a compression spring arranged between"

Signed and Sealed this

*Eighteenth* Day of *June 1985*

[SEAL]

*Attest:*

DONALD J. QUIGG

*Attesting Officer*

*Acting Commissioner of Patents and Trademarks*